(12) United States Patent
Yang et al.

(10) Patent No.: US 8,559,213 B2
(45) Date of Patent: Oct. 15, 2013

(54) SUB-THRESHOLD MEMORY CELL CIRCUIT WITH HIGH DENSITY AND HIGH ROBUSTNESS

(75) Inventors: Jun Yang, Jiangsu (CN); Na Bai, Jiangsu (CN); Jie Li, Jiangsu (CN); Chen Hu, Jiangsu (CN); Longxing Shi, Jiangsu (CN)

(73) Assignee: Southeast University (CN)

( * ) Notice: Subject to any disclaimer, the term of this patent is extended or adjusted under 35 U.S.C. 154(b) by 177 days.

(21) Appl. No.: 13/322,859

(22) PCT Filed: Aug. 13, 2009

(86) PCT No.: PCT/CN2009/073250
§ 371 (c)(1),
(2), (4) Date: Nov. 28, 2011

(87) PCT Pub. No.: WO2011/017443
PCT Pub. Date: Feb. 17, 2011

(65) Prior Publication Data
US 2012/0069650 A1    Mar. 22, 2012

(51) Int. Cl.
*G11C 11/00* (2006.01)
(52) U.S. Cl.
USPC .......................................................... 365/154
(58) Field of Classification Search
None
See application file for complete search history.

(56) References Cited

U.S. PATENT DOCUMENTS

| | | | | |
|---|---|---|---|---|
| 4,725,981 A * | 2/1988 | Rutledge | ........................ | 365/154 |
| 5,631,863 A * | 5/1997 | Fechner et al. | ................ | 365/156 |
| 6,058,041 A * | 5/2000 | Golke et al. | .................. | 365/156 |
| 6,061,268 A | 5/2000 | Kuo et al. | | |
| 6,285,578 B1 | 9/2001 | Huang | | |
| 6,775,178 B2 * | 8/2004 | Liu et al. | ........................ | 365/154 |
| 6,801,449 B2 * | 10/2004 | Kobayashi et al. | ........... | 365/154 |
| 7,233,518 B2 * | 6/2007 | Liu | ................ | 365/156 |
| 7,693,001 B2 * | 4/2010 | Golke et al. | ............. | 365/230.05 |
| 2003/0031040 A1 | 2/2003 | Hirano et al. | | |

FOREIGN PATENT DOCUMENTS

| | | |
|---|---|---|
| CN | 1402353 A | 3/2003 |
| CN | 1992280 A | 7/2007 |

OTHER PUBLICATIONS

International Search Report dated Dec. 17, 2009 from International Application No. PCT/CN2009/073250, filed Aug. 13, 2009 (4 pages).

* cited by examiner

*Primary Examiner* — Vanthu Nguyen
(74) *Attorney, Agent, or Firm* — Schmeiser, Olsen & Watts LLP

(57) ABSTRACT

A high-density and high-robustness sub-threshold memory cell circuit, having two PMOS transistors P1 and P2 and five NMOS transistors N1~N5, wherein, the each base electrode of the two PMOS transistors and NMOS transistors N3, N4, and N5 is connected with the local grid electrode respectively; the base electrode of the NMOS transistors N1 and N2, are grounded respectively; the NMOS transistor N1 form an phase inverter with the PMOS transistor P1, and the NMOS transistor N2 form another phase inverter with the PMOS transistor P2; the two phase inverters are connected with each other in a cross coupling manner via the cut-off NMOS transistor N5, the output end of the phase inverter N1 and P1 directly connected to the input end of the phase inverter N2 and P2, and the output end of the phase inverter N2 and P2 connected to the input end of the phase inverter N1 and P1 via the cut-off NMOS transistor N5; the NMOS transistor N3 is connected with the write bit line (WBL) of the phase inverter N1 and P1, and the NMOS transistor N4 is connected with the NOT WBL and read word line (RWL) of the phase inverter N2 and P2.

1 Claim, 5 Drawing Sheets

SUB-THRESHOLD MEMORY CELL CIRCUIT WITH HIGH DENSITY AND HIGH ROBUSTNESS

FIELD OF THE INVENTION

The present invention relates to a memory cell operating in its sub-threshold working area, particularly to a high-density and high-robustness sub-threshold memory cell circuit. The circuit can operate at 200 mV supply voltage and characterized by the high density, high robustness and extremely low power consumption and so on.

BACKGROUND OF THE INVENTION

Memory cell array is an important component in modern digital systems, and is often a bottleneck of power consumption in the system design. As the demand for portable devices increases in the market, it requires higher technique for reducing power consumption in memory cell arrays. Sub-threshold design is a focus in extremely low power design nowadays. By reducing the supply voltage (Vdd) gets into the sub-threshold area of circuit—Vdd is lower than the threshold voltage (Vth), so that the system can operate in the linear range of the circuit, and thereby the dynamic and static power consumption of the system can be reduced significantly. The design of sub-threshold memory cell array further highlights the advantage of sub-threshold design in low power consumption. However, in the actual implementation process, the said design introduces a series of problems: 1) the static noise margin (SNM) is degraded severely; 2) the writing performance is weakened; 3) the tolerance to process deviations is degraded, etc. To solve these problems, some sub-threshold memory cells that can be operate at 200~300 mV have been put forward. However, all these designs are implemented at the expense of the density of memory cells.

In a normal state, the read noise margin is the smallest when compared with the hold noise margin and the write noise margin. Therefore, the read noise margin is a key in memory cell design. In some designs, two NMOS transistors are added on the basis of six-transistor memory cell design, so that the data in internal nodes will not be affected in the process of reading out the internal data in the memory cell. In such designs, the read noise margin of the sub-threshold memory cell is equal to the hold noise margin of the memory cell. However, when compared with the conventional six-transistor memory cells, the memory cells in such a structure consume 30% more area. A single-end six-transistor sub-threshold memory cell is put forth. Though the robustness of a memory cell in such a single-end structure is higher in the reading process, the writing performance of the structure is lower, and the aid of a write-assist unit is required in the writing process. In addition, in order to solve the problem of susceptibility of the sub-threshold circuit to process deviations, the said design commonly employs transistors in a larger size. As a result, the density obtained in the design is also effected to a certain extent.

With sub-threshold design technique, the power consumption of the system can be reduced by square. The sub-threshold memory circuit design is proven that the dynamic and static power consumption of the memory cells can be reduced by square along with the supply voltage decreasing. In view of the capacity of the memory cell array, the reduction of the power consumption is highly considerable. However, a circuit operating in its sub-threshold area has unique circuit characteristics. The approach of making trade-off among reading performance, writing performance and chip area of a memory cell by adjusting the size of transistors in the memory cell in the conventional design (in the super-threshold state) is completely unable to meet the demand of sub-threshold circuit design. Therefore, the design of high-density and high-robustness sub-threshold memory cell is the bottleneck in the sub-threshold circuit design walking up to industrialization.

SUMMARY OF THE INVENTION

To overcome the drawbacks in the prior art, the present invention provides a high-density and high-robustness sub-threshold memory cell circuit so as to balance the technical indexes of the memory cell and achieve optimal overall system performance. In the present invention, on the basis of the actual characteristics of the sub-threshold circuit, a high-density and high-robustness memory cell with double-end writing and single-end reading features is designed. The memory cell achieves the optimal write noise margin, optimal read noise margin and optimal hold noise margin while requiring extremely low power consumption. In addition, thanks to its high-density design, the chip area consumed by the memory cell array is the smallest among the known chips at present. Thus, that design makes industrialization and commoditization of sub-threshold memory cells possible.

To obtain the objects described above, the following technical scheme is employed in the present invention:

A high-density and high-robustness sub-threshold memory cell circuit characterized in that having high-density and high-robustness sub-threshold memory cell circuit with double-end writing and single-end reading features, comprising two PMOS transistors P1 and P2 and five NMOS transistors N1, N2, N3, N4, and N5, all of said seven transistors form the said sub-threshold memory cell circuit; wherein, the each base electrode two PMOS transistors and NMOS transistors N3, N4 and N5 is connected with the local grid electrode of the transistor respectively, the base electrode and source electrode of NMOS transistors N1 and N2 are grounded, the source electrode of the two PMOS transistors are connected with the supply voltage, the drain electrode and grid electrode of the NMOS transistor N1 are connected with the drain electrode and grid electrode of the PMOS transistor P1 respectively, so as to form a phase inverter; the drain electrode and grid electrode of the NMOS transistor N2 are connected with the drain electrode and grid electrode of the PMOS transistor P2 respectively, so as to form another phase inverter; the drain electrode of the NMOS transistor N1 and the drain electrode of the PMOS transistor P1 are connected with the grid electrode of the NMOS transistor N2 and the grid electrode of the PMOS transistor P2 respectively, the connection end between the grid electrode of the NMOS transistor N1 and the grid electrode of the PMOS transistor P1 is connected with either the source electrode or drain electrode of the NMOS transistor N5 with the connection end between the drain electrode of the NMOS transistor N2 and the drain electrode of the PMOS transistor P2 respectively, the grid electrode of the NMOS transistor N5 is connected with the NOT read word line (NOT RWL) of external control signal, the connection end between the drain electrode of the NMOS transistor N1 and the drain electrode of the PMOS transistor P1 is connected to either the source electrode or drain electrode of the NMOS transistor N3 with the write bit line respectively, the grid electrode of the NMOS transistor N3 is connected with the write word line (WWL), the connection end between the drain electrode of the NMOS transistor N2 and the drain electrode of the PMOS transistor P2 is connected to either the source electrode or drain electrode of the NMOS transistor N4 with the bit line shared by the NOT write bit line (NOT WBL) and the read bit line (RBL) respectively, the grid electrode of the NMOS transistor N4 is connected with the word line shared by the write word line (WWL) and the read word line (RWL).

In above circuit, the NMOS transistors N3 and N4 serve as matching transistors, and the NMOS transistor N5 serves as a cut-off transistor. Since the circuit provided in the present invention is designed for the operation of sub-threshold memory cell, the operating mode of the circuit allows for dynamic switching between the source electrode and the drain electrode in the three transistors N3, N4 and N5, that is to say, the source electrode and drain electrode in the three transistors can be switched over automatically as the variety of potentials at the two connection ends which connected to the said source electrode and drain electrode respectively. Therefore, the source electrode and drain electrode in transistors N3, N4 and N5 can be connected with their corresponding connection ends at random. Compared to the prior art, the present invention has the following advantages and significant effects:

(1) The unit area consumption is the smallest among known sub-threshold memory cells at present. The circuit structure of the seven transistors is simple and reliable. The present invention is less susceptible to process deviations, each transistor is designed in minimum size and has no requirement for proportional design.

(2) The base electrode of P1, P2, and N3~N5 transistors are connected with the grid electrodes of their corresponding transistor respectively. In the transistors N1 and N2, the base electrode is grounded respectively like the case in the conventional design, therefore, the present invention ensures the balance of the pull-up and pull-down driving capability, while the ON/OFF current of the matching transistor in the memory cell can be increased. Such an arrangement brings two benefits: a) the balanced pull-up and pull-down driving capability ensures robustness of the memory cell. b) the ON/OFF current of the sub-threshold memory cell provided in the present invention is the largest among the sub-threshold memory cells known at present. Thus, the effect of drain current accumulated in unselected memory cells will be reduced. As a result, more memory cells can be supported on the same bit line. Thus, in another aspect, the present invention overcomes a common drawback that only a few of memory cells can be connected in series on the same bit line in existing sub-threshold memory cell arrays so as to increase the capacity and density of sub-threshold memory cell array.

(3) By reading through a single-end read word line (RWL) and writing through a write bit line (WBL) and a NOT WBL ($\overline{WBL}$) at the same time, the present invention achieves a higher read noise margin without lossing the writing performance of the memory cell. Therefore, the memory cell circuit can operate normally without any write-assist unit or sensitive amplifier. Introducing the cut-off transistor N5 is tactfully use the characteristics below that the P-type transistors and N-type transistors in the sub-threshold area transmit complete data signals when $|Vgs|>0$, but transmit the data signals with loss when $|Vgs|=0$, which is to say, the cut-off transistor N5 is switched off $|Vgs|=0$ in the reading cycle so as to prevent disturbance of external information to the internal nodes; the cut-off transistor N5 is switched on $|Vgs|>0$ in the write cycle and hold cycle so as to enhance writing performance and holding performance.

DETAILED DESCRIPTION OF THE EMBODIMENTS

Figure 1:
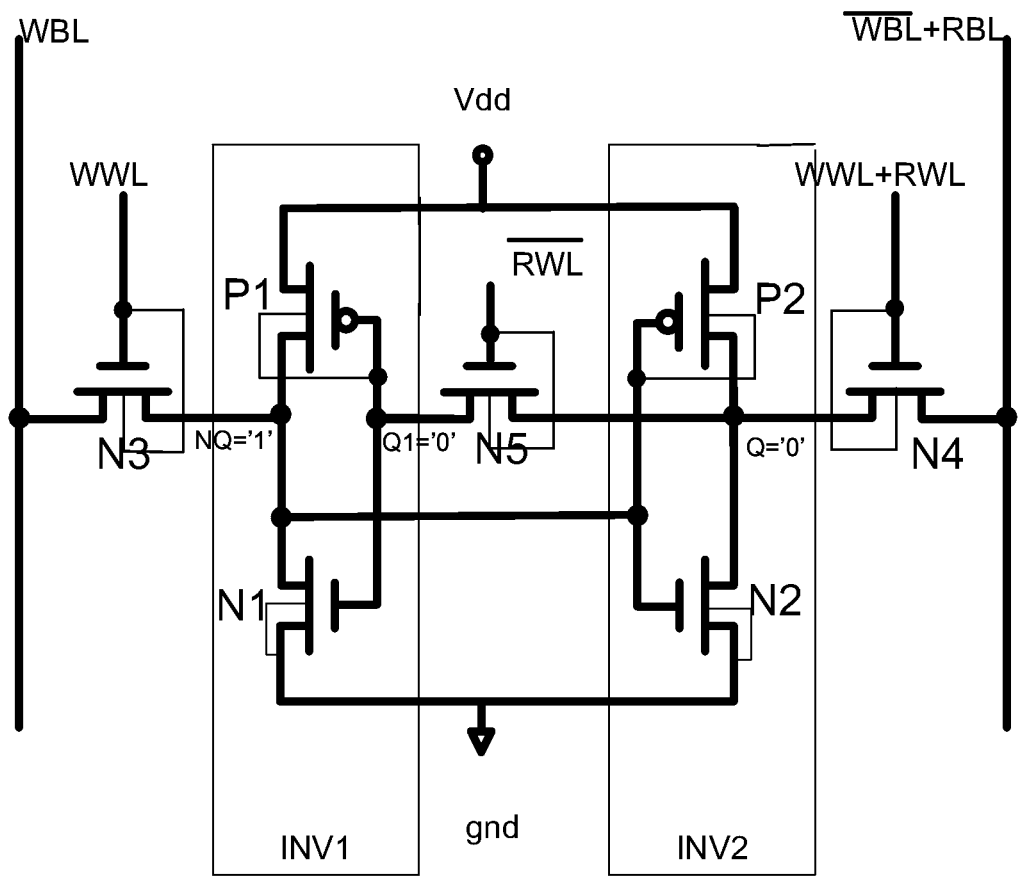
FIG. 1 is a structural diagram of the high-density and high-robustness sub-threshold memory cell circuit provided in the present invention.

As shown in FIG. 1, the high-density and high-robustness sub-threshold memory cell circuit provided in the present invention comprises 7 transistors, two P-type transistors (P1, P2) and five N-type transistors (N1~N5). Wherein, the base electrodes of P1, P2 and N3~N5 transistor are connected with the grid electrodes of their corresponding transistor respectively. In transistors N1 and N2, the base electrode is connected with the conventional gnd. N1, P1 and N2, P2 form two phase inverters (INV1, INV2) respectively, and the two phase inverters are connected with each other via a cut-off transistor N5 in a cross coupling manner: the output end of INV1 composed of N1 and P1 is directly connected to the input end of INV2 composed of N2 and P2, and the output end of INV2 is connected to the input end of INV1 via the cut-off transistor N5. The grid electrode of N5 is connected with the NEG signal $\overline{RWL}$ of the read word line (RWL) of external control signal. N3 and N4 are matching transistors: INV1 is connected with the write bit line (WBL) via N3, and the grid electrode of N3 is connected with the write word line (WWL); INV2 is connected with the bit line ($\overline{WBL}$+RBL) shared by the NOT WBL and the RBL via N4, and the grid electrode of N4 is connected with the word line shared by the WWL and RWL (WWL+RWL).

During the actual operation process of the present invention, the read operation is accomplished by single-end reading, i.e., the transistor N4 is switched on and the transistor N5 is switched off under the control of the RWL signal, the internal information in the memory cell is transmitted to the read bit line (RBL), and the logic signal on the RBL is read at one end and the internal information in the memory cell is recognized. In the write operation, the RWL signal is disabled, and the matching transistors N3, N4 and the cut-off transistor N5 are in ON state via WWL signal control. The signal on the WBL and the signal on the NOT WBL ($\overline{WBL}$) is transmitted into the internal nodes via the matching transistors N3 and N4 so as to change the information in the memory cell, so that the double-end write operation is accomplished.

Since the driving power of P-type transistor is significantly lower than that of N-type transistor, in the present invention, the base electrode in the pull-up transistors P1 and P2, matching transistors N3 and N4, and the cut-off transistor N5 are connected to the local grid electrode respectively, while the base electrode in transistor N1 and N2 is directly connected to gnd as usual. With that arrangement, the limitation to the number of memory cells on each bit line related with "1" Read operation is overcome properly, while maintaining balanced reading and writing performance of the memory cell. Another benefit of such an arrangement is the present invention is less susceptible to process deviations so that higher tolerance to process deviations is obtained without enlarging the transistors of the memory cell, that is to say, even with transistors in minimum size, a high success rate can be obtained for logic cell arrays that composed of the memory cells provided in the present invention.

The working principle of the high-density and high-robustness sub-threshold memory cell circuit in the present invention is as follows:

A. Read Operation

For a common memory cell, if suppose that the logic value of storage of the memory cell is 0 (i.e., Q is "0"), and therefore NQ is "1". After the precharge cycle, in the "0" read operation, the voltage Q increases along with the bit line which pre-charged to the supply voltage (Vdd). When the voltage is higher than the trip voltage (Vtrip) of the phase inverter, the memory cell will undergo a wrong "1" writing process. That process is called as write destroy in memory cell design. In the present invention, after the precharge cycle, RWL is set to 1, and Q will be pulled up to a precharged value which higher than the RBL voltage. Since the cut-off transistor is switched off in the read operation in the present invention, the Q1 voltage will not change significantly with Q value. In that way, the signal interference of external information to the internal nodes in the memory cell is prevented. Therefore, the problem of low read noise margin in sub-threshold memory cells is solved.

B. Write Operation

High read noise margin and high hold noise margin are also very important in the design of sub-threshold SRAM. In the actual write operation, the RBL is set to 0, and the cut-off transistor (N5) is switched on (|Vgs|>0). Since the transistors can transmit data information without loss when it is switched on in the sub-threshold area, the Q1 node can change along with the Q node varies. In addition, the double-end writing arrangement and the positive feedback obtained from cross coupling of the two phase inverters (INV1 and IVN2) ensure high write noise margin and hold noise margin in the present invention.

C. Increase Density of the Memory Cells

Figure 2:
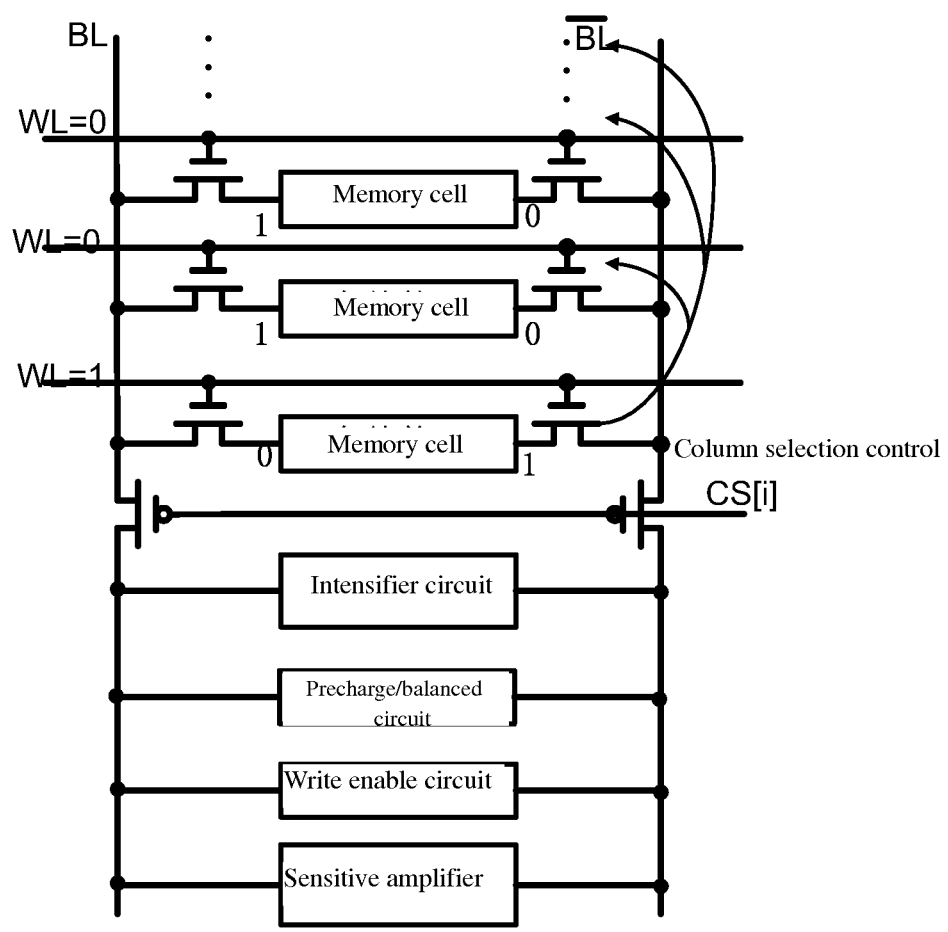
FIG. 2 shows a logic block diagram of a sub-threshold memory cell array and a schematic diagram of influence of drain current on the bit line in the worst case.

The Ion/Ioff ratio is an important factor in the design of memory cell arrays. In the ordinary design (super-threshold state), the Ion/Ioff ratio is approximately $10^7$, while the Ion/Ioff ratio is only $10^3$-$10^4$ in sub-threshold design. If there is no enough redundancy (the number of memory cells connected in series on the bit line is greater than a threshold), the Ion of selected memory cell may be interfered by the drain current that accumulated in the unselected memory cells, as a consequence, the follow-up circuit can't recognize the correct logic subsequently and will result in read/write failure of the memory cell (FIG. 2). In view of process deviations and the bias voltage of the follow-up sensitive amplifier, the number of memory cells on a bit line will be further limited. At present, there are two trends in the design of sub-threshold memory cell arrays: 1) calculate the proportional relation of Ion/Ioff of the transistors within various process angles, and control the number of memory cells on the same bit line strictly [1, 2]; 2) introduce drain current compensation logic in the memory cell [3, 4]. However, memory cell arrays are high-capacity logical units and have high requirements for design density. Both methods described above can't effectively solve the problem of large chip area consumption in memory cell array.

Figure 3:
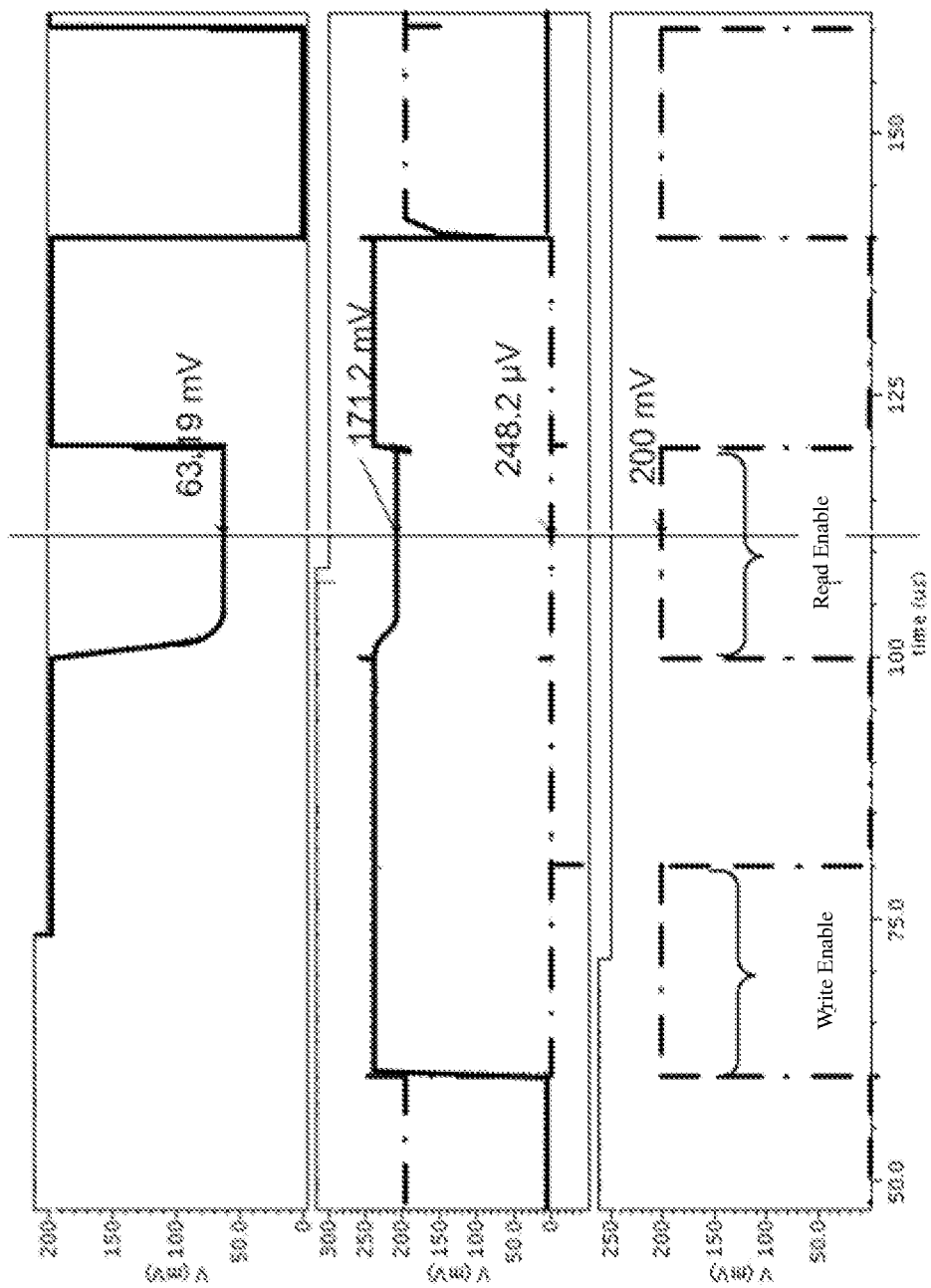
FIG. 3 is an output waveform diagram of the bit line during reading of "1" in a conventional sub-threshold memory cell that which connected in series with 64 memory cells on the same bit line.
Figure 4:
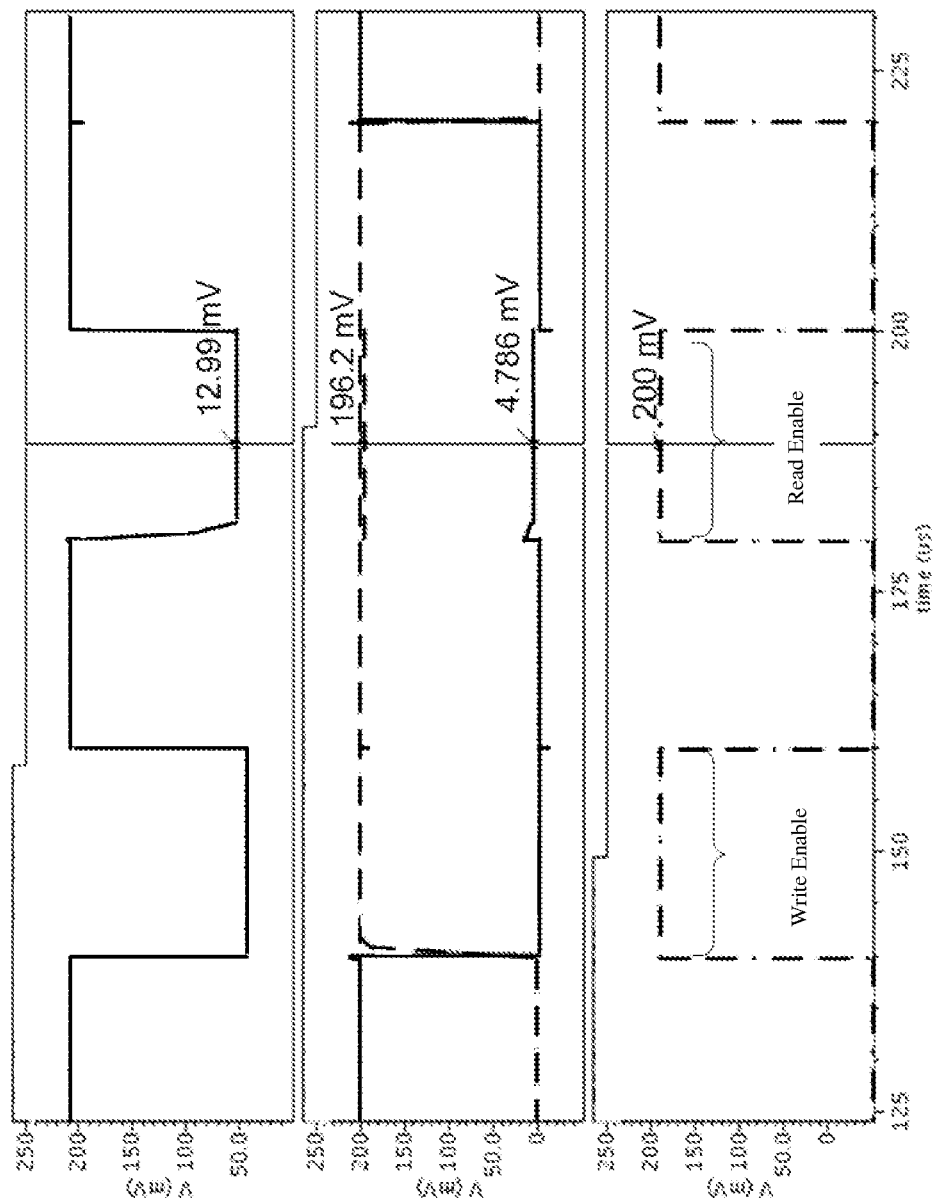
FIG. 4 is an output waveform diagram of the bit line during reading of "0" in a conventional sub-threshold memory cell that which connected in series with 64 memory cells on the same bit line.

Actually, the driving power of P-type transistor is significantly lower than that of N-type transistor (the minimum drain current of P-type transistor is approximately 22% of N-type transistor under |Vds|=|Vgs|=200 mV, 0.13 μm process). FIG. 3 and FIG. 4 show the simulation results of "1" reading and "0" reading from a bit line with 64 memory cells connected in series. All the transistors are in minimum transistor width and are connected ordinarily (the base electrode of P-type transistor is connected to the supply voltage Vdd, and the base electrode of N-type transistor is connected to gnd). The simulation results obtained in the read cycle of a memory cell array are the worst case (the information stored in the unselected memory cells is opposite to the information in the selected memory cells). In the FIG. 3, in "1" read operation, the voltage of RBL of memory cells is pulled down to 63.19 mV, causing a read error of the memory cell array. The information of the nodes in the storage cells is also affected. In contrast, in "0" read operation, the voltage of RBL is pulled down to a very low value (12.99 mV), and therefore the information of the nodes in the storage cells is less affected (as shown in FIG. 4). It seems that the probability of errors in "1" read operation is higher than that in "0" read operation in the sub-threshold area, due to the adverse effect of drain current accumulated in unselected memory cells. That is to say, the number of memory cells that can be connected in series on the bit line is limited by the Ion and Ioff during "1" read operation.

According to the threshold voltage assignment formula:

$$V_{th} = V_{th0} - \gamma(\sqrt{|-2\phi_F|} - \sqrt{|-2\phi_F| + V_{BS}}) - \eta V_{SD}$$

Wherein, $V_{th0}$ is the threshold voltage when $V_{BS}=0$, $\gamma$ is the body effect factor. $2\phi_F$ is the surface potential of silicon, and $V_{BS}$ is the potential difference between the source electrode and the base electrode. In the present invention, the base electrode of the pull-up transistors P1 and P2, matching transistors N3 and N4, and cut-off transistor N5 is connected to the local grid electrode respectively. The benefits of that connection mode include: 1) When the transistor is in ON state, the threshold voltage is low, and the Ion is high, and therefore the improved current increases the driving power of the transistor; 2) when the transistor is in OFF state, the threshold voltage is equal to the threshold voltage in the ordinary connection mode of base electrode, and therefore the electrical properties of Ioff etc. are the same. In that design mode, the Ion/Ioff ratio of the present invention is improved, and thereby the adverse effect of drain current to the performance of circuit in sub-threshold area is reduced in one aspect. However, it's worth noting that the base electrode is connected with the source electrode only in P1, P2, and N3~N5 in the present invention, but the base electrode in N1 and N2 is still directly connected to gnd respectively, in view of the fact that the pull-down capability of N-type transistor is higher than pull-up capability of P-type transistor in the sub-threshold area.

Figure 5:
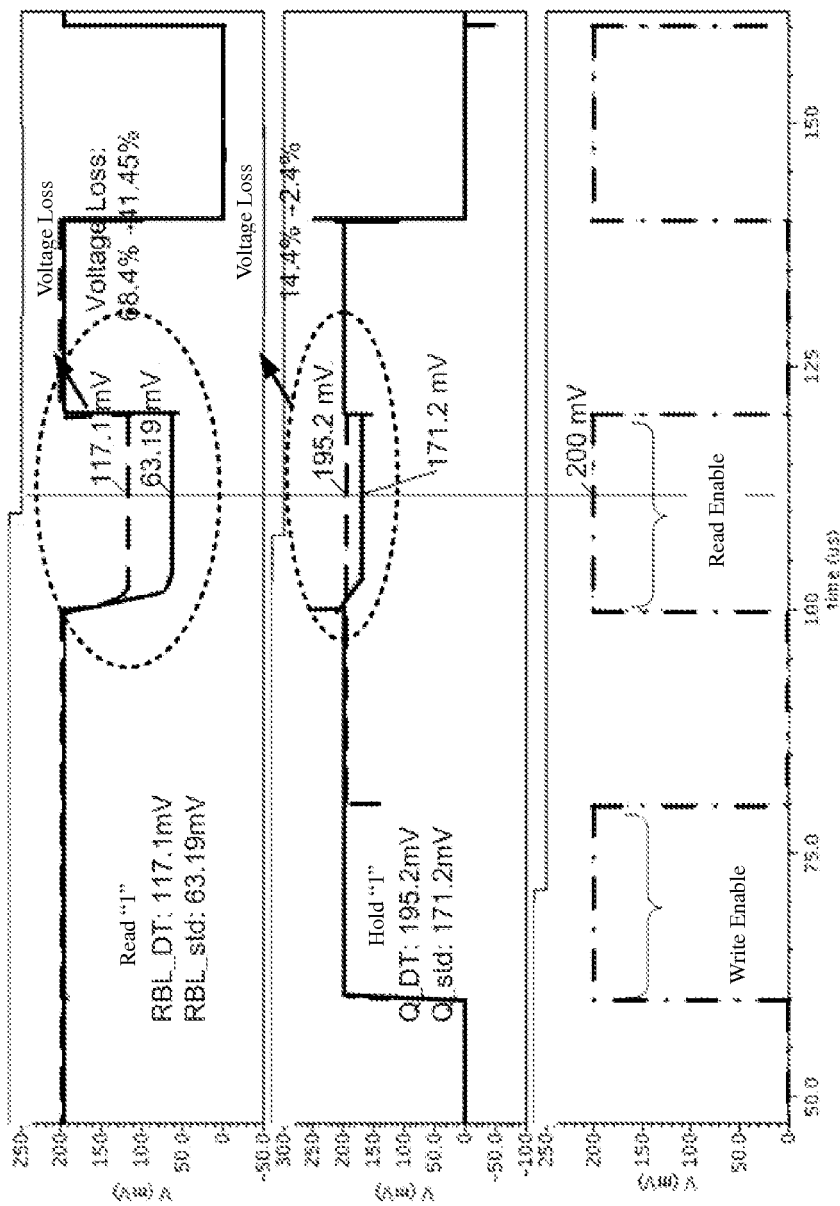
FIG. 5 shows the comparison of output waveform between the sub-threshold memory cell provided in the present invention and the conventional sub-threshold memory cell during reading of "1" under the same conditions.

FIG. 5 shows that the potential of reading from RBL is 117.1 mV, owing to the increased Ion/Ioff ratio. The voltage loss of RBL is reduced from 68.4% to 41.45%. In "1" read operation, the voltage of internal nodes in memory cells is held at 97.6% of the supply voltage (logic "1"), whereas the voltage of internal nodes in conventional memory cells can be only held at 85.6% of the supply voltage.

In the design described above, the present invention doesn't require large-size transistors and the unit density is lower. Since a bit line can support more memory cells, the memory cell arrays implemented with the circuit provided in the present invention can have higher capacity and higher overall density.

With the technical schemes of the present invention, the limitation to the number of memory cells on each bit line related with "1" read operation is overcome properly, while maintaining balanced reading and writing performance of the memory cell. Another benefit of the connection mode in the present invention is: the present invention is less susceptible to process deviations so that the higher tolerance to process deviations is obtained without enlarging the transistors of the memory cell, that is to say, even with transistors in minimum size, a high success rate can be obtained for logic cell arrays composed of the memory cells provided in the present invention.

The invention claimed is:

1. A high-density and high-robustness sub-threshold memory cell circuit, which is provide with high-density and high-robustness sub-threshold memory cell circuit with double-end writing and single-end reading features, comprising two PMOS transistors P1 and P2 and five NMOS transistors N1, N2, N3, N4, and N5, all of said seven transistors form the said sub-threshold memory cell circuit; wherein, the each base electrode of the two PMOS transistors and NMOS transistors N3, N4 and N5 is connected with the local grid electrode respectively, the base electrode and source electrode of the NMOS transistors N1 and N2 are grounded respectively, the source electrode of the two PMOS transistors are connected with the supply voltage, the drain electrode and grid electrode of the NMOS transistor N1 are connected with the drain electrode and grid electrode of the PMOS transistor P1, respectively, so as to form a phase inverter; the drain electrode and grid electrode of the NMOS transistor N2 are connected with the drain electrode and grid electrode of the PMOS transistor P2 respectively so as to form another phase inverter; the drain electrode of the NMOS transistor N1 and the drain electrode of the PMOS transistor P1 are connected with the grid electrode of the NMOS transistor N2 and the grid electrode of the PMOS transistor P2 respectively, the connection end between the grid electrode of the NMOS transistor N1 and the grid electrode of the PMOS transistor P1 and the connection end between the drain electrode of the NMOS transistor N2 and the drain electrode of the PMOS transistor P2 are connected with either the source electrode or drain electrode of the NMOS transistor N5 respectively, the grid electrode of the NMOS transistor N5 is connected with the NOT read word line (NOT RWL) of external control signal, the connection end between the drain electrode of the NMOS transistor N1 and the drain electrode of the PMOS transistor P1 and the write bit line are connected with either the source electrode or drain electrode of the NMOS transistor N3 respectively, the grid electrode of the NMOS transistor N3 is connected with the write word line (WWL), the connection end between the drain electrode of the NMOS transistor N2 and the drain electrode of the PMOS transistor P2 and the bit line shared by the NOT write bit line (NOT WBL) and the read bit line (RBL) are connected with either the source electrode or drain electrode of the NMOS transistor N4 respectively, the grid electrode of the NMOS transistor N4 is connected with the word line shared by the write word line (WWL) and the read word line (RWL).

* * * * *